(12) United States Patent
Henry et al.

(10) Patent No.: US 6,424,166 B1
(45) Date of Patent: Jul. 23, 2002

(54) PROBE AND TEST SOCKET ASSEMBLY

(76) Inventors: David W. Henry, 1151 Blue Bird La., Liberty, MO (US) 64068; William E. Thurston, 4909 N. College, Kansas City, MO (US) 64119; Timothy W. Dowdle, 12013 Noland Rd., Overland Park, KS (US) 66213

( * ) Notice: Subject to any disclaimer, the term of this patent is extended or adjusted under 35 U.S.C. 154(b) by 0 days.

(21) Appl. No.: 09/616,208

(22) Filed: Jul. 14, 2000

(51) Int. Cl.⁷ .................. G01R 31/02; G01R 1/073
(52) U.S. Cl. .................. 324/755; 324/761
(58) Field of Search .................. 324/754, 755, 324/761; 439/66, 68

(56) References Cited

U.S. PATENT DOCUMENTS

| 4,885,533 | A |  | 12/1989 | Coe | 324/158 P |
| 5,641,315 | A |  | 6/1997 | Swart et al. | 439/824 |
| 5,727,954 | A | * | 3/1998 | Kato et al. | 439/66 |
| 5,850,147 | A |  | 12/1998 | Stowers et al. | 324/761 |
| 6,046,597 | A | * | 4/2000 | Barabi | 324/761 |
| 6,140,830 | A | * | 10/2000 | Ott | 324/761 |
| 6,208,155 | B1 | * | 3/2001 | Barabi et al. | 324/755 |

OTHER PUBLICATIONS

IDI Catalog and Source Book 5th Edt; Interconnect Devices, Inc., 5101 Richland Ave., Kansas City, Kansas 66106; published prior to Jul. 14, 2000.

* cited by examiner

*Primary Examiner*—Ernest Karlsen
(74) *Attorney, Agent, or Firm*—Wm. Bruce Day

(57) ABSTRACT

A probe and test socket assembly wherein spring biased plunger probes of extraordinarily small diameter, such as 0.02 inch, are densely packed into a test socket for testing of integrated circuit chips. The socket is constructed in upper and lower halves with bores to receive the probes. To manufacture probes of such small diameter and to provide minimal and constant electrical resistance, the plungers and barrel of the probes are not crimped or otherwise secured together. The configuration of the socket bore walls in combination with the probe maintains the probe plunger and barrel together. The assembly is particularly useful in densely packed arrays of extremely fine diameter probes for testing densely packed test sites.

1 Claim, 2 Drawing Sheets

PROBE AND TEST SOCKET ASSEMBLY

This invention relates to spring biased electrical contact probes in general and specifically to such probes that are of extremely small size and used in densely packed electrical test sockets.

BACKGROUND

Test sockets are used in the electrical circuit test industry as an interface between a test circuit board and the device under test, commonly called a DUT. Test sockets are normally used for a DUT that has relatively densely packed contact points. Such a device could be an integrated circuit chip, commonly called an IC. The test socket is configured to receive a particular configuration of IC. Electrical test spring contact probes in the well of the test socket extend to the other side of the socket and contact a circuit board on which the test socket is mounted. The test sockets and their loaded probes establish an electrical contact path between the DUT and the circuit board.

Particularly with complex and expensive IC's, reliability of the test readings is of critical importance, for such DUT's are normally costly and failing a DUT because of test socket and probe failure can lead to a needlessly high rejection rate which increases the cost of manufacture. It is normally preferred to test the IC before soldering the IC to a circuit board and then functionally testing the finished article. If the IC then fails, scrapping the finished article is extremely expensive both in terms of material and time costs. An integrated circuit of complexity with densely packed pad contacts is expensive, making accuracy and reliability of the test equipment critical.

The test equipment is even more expensive and a test socket densely packed with test probes more expensive yet. Because of the costs involved, these devices must be reliable and have long life. Test sockets produced by the assignee of the present invention are expected to provide reliable readings for over 500,000 cycles.

Probes used in the test sockets provide the interconnection between the test circuit board and the IC. These must stand up for over 500,000 cycles and are of extremely small dimension. For example, contact probes in a test socket must be approximately 0.02 inch in diameter and may have a fully extended length of 0.2145 inches. Such probes are extremely difficult to manufacture, as they typically consist of a barrel, a coiled spring within the barrel and extensible plunger extending from the barrel and biased to an extended position by the coil spring. Heretofore, the barrel has been crimped about a reduced area of the plunger, allowing the plunger to reciprocate relative to the barrel. Crimping requires an extra step of manufacture and is difficult in an item so small. Moreover, it results in reduced surface area of contact between the plunger and barrel, leading to decreased surface area of contact and greater resistance. Electrical resistance is inversely proportional to the square of the cross-sectional area of contact. By increasing the surface area of contact, there is less resistance. The inventor has determined that minimal, constant resistance in the contact probe is of great importance in increasing reliability of the testing sequence.

SUMMARY OF THE INVENTION

The present invention provides a combination probe and test socket assembly in which a probe of extremely small size, such as 0.02 inch diameter, is formed with a barrel, a hollow plunger shaft and an interior coil spring which urges the plunger into an extended position relative to the barrel. The probe is double ended; that is, the barrel has a contact tip and the plunger has a contact tip, allowing the probe to connect linearly spaced electrical test sites. The probe is designed for maximum electrical contact, leading to extremely low resistance and does not have a crimp or other conventional connecting means. The bore through the test socket for the probe is designed with upper and lower inner shoulders and the socket is of a two-piece, upper and lower section design. To fit the probe into the bore, the upper and lower sections are separated and the probe inserted therein. The upper and lower shoulders within the bore keep the probe together. The probe provides extremely low and consistent electrical resistance.

OBJECTS OF THE INVENTION

The objects of the present invention are:

to provide a probe and test socket assembly wherein the probe is of extremely high consistent and low electrical resistance;

to provide a test socket wherein the probes are of extraordinarily small size and can be densely packed for testing integrated circuit chips;

to provide such a probe which can be manufactured with a high degree of accuracy and low cost; and to provide such a probe and test socket assembly which is able to withstand a high amount of cycles, such as 500,00 cycles before changeout.

Other objects and advantages of the invention will become apparent from the following description.

DESCRIPTION OF THE PREFERRED AND ALTERNATE EMBODIMENTS

Detailed embodiments of the invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for teaching one skilled in the art to variously employ the present invention in any appropriately detailed form, and as a basis for the claims.

Figure 1:
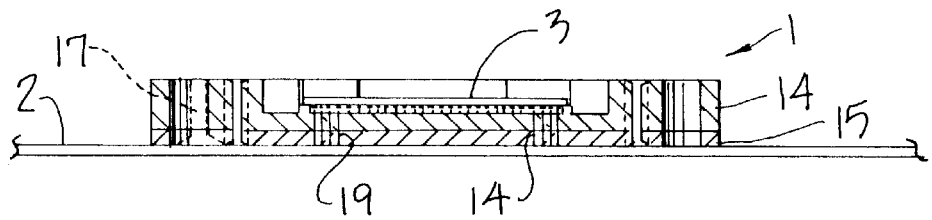
FIG. 1 is a cross-sectional view showing the probe and test socket assembly mounted upon a circuit board and with an integrated circuit chip positioned in the well of the test socket.

The reference numeral one, FIG. 1, generally indicates a test socket which is mounted upon a circuit board 2 which is part of an automated testing apparatus (not shown). The automated testing apparatus is computer-controlled to provide a sequence of electrical impulses through the circuit board 2, the test socket 1 and into an integrated circuit chip 3, which constitutes the device under test (DUT). The test socket I contains a densely packed array of extremely small diameter probes 4. These probes 4 each contain a barrel, plunger and internal spring which biases the plunger outwardly of the barrel.

Figures 2, 3:
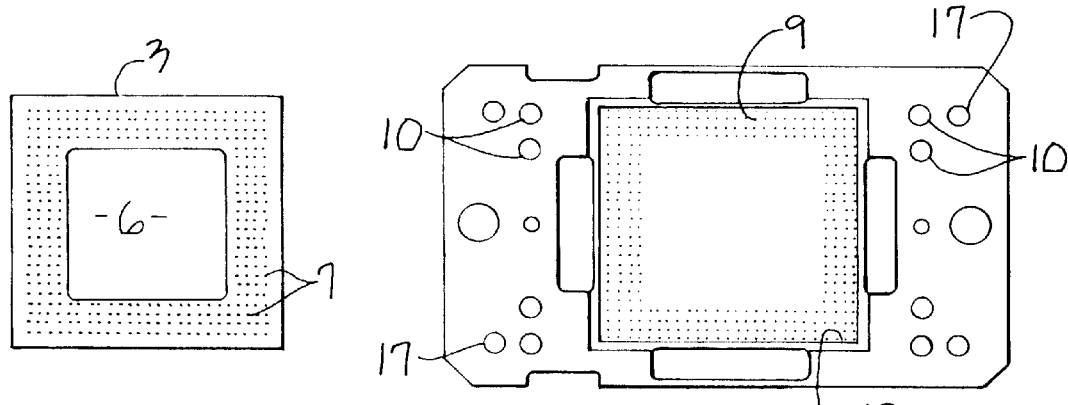
FIG. 2 is a bottom view of a typical integrated circuit chip of a type tested by the assembly.
FIG. 3 is a top view of the test socket showing the well in which integrated circuit chips are placed for testing.

So that the reader may appreciate the densely packed nature of a typical IC3 to be tested by the arrangement shown in FIG. 1, such an IC is shown full size in FIG. 2. The IC consists of a central processing area 6 and four rows of contacts 7. Typically, the contacts 7 are solder ball contacts, as distinguished from the bent wire foot contacts of older generation IC's. The configuration of the IC3 is mirrored in the well 9 of the test socket 1. In the illustrated example, the test socket 1, as seen from the top in FIG. 3, includes opposite screw holes 10 for connection to the circuit board 2 and recesses in the well wall 12 to permit handling of the IC3 by an automatic handling device.

The test socket 1 is preferably formed of synthetic resinous material and has upper and lower halves 14 and 15. The halves are connected together, as by fasteners 17. Arrayed in the well 9 are a plurality of through holes or bores 19. The array of the bores 19 matches the array of the contacts 7 on the IC3; that is, the test socket 1 is particularly configured to receive and test a selected IC3.

The bore 19 is of a particular and unusual configuration, not being a simple straight-sided hole, but configured to fit the particular probe 4 and retain the probe together. In particular, the bore 19 has concentric upper and lower outlets 21 and 22 and a coaxial inner bore 24 of larger diameter than the bore outlets 21 and 22. Upper and lower shoulders 26 and 27 are formed at the junctures of the inner bore 24 with the upper and lower outlets 21 and 22. In the illustrative example, the shoulders 26 and 27 are chamfered. The dimensions of the bore 19 are particularized to close tolerances to the dimensions of the probe 4.

Figure 4:
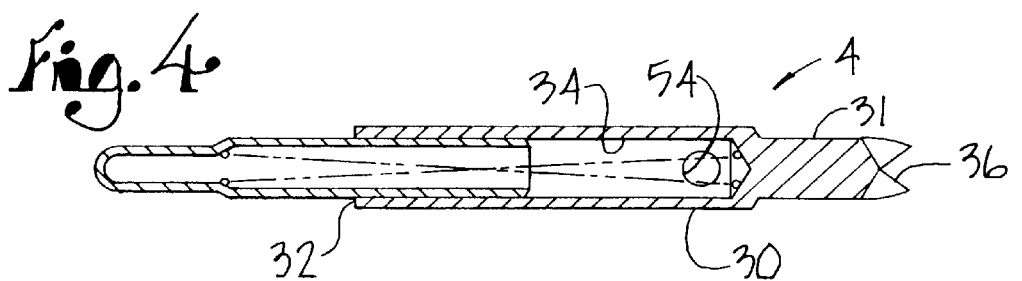
FIG. 4 is a longitudinal sectional view of the probe as it would be in a free state within the test socket.
Figure 5:
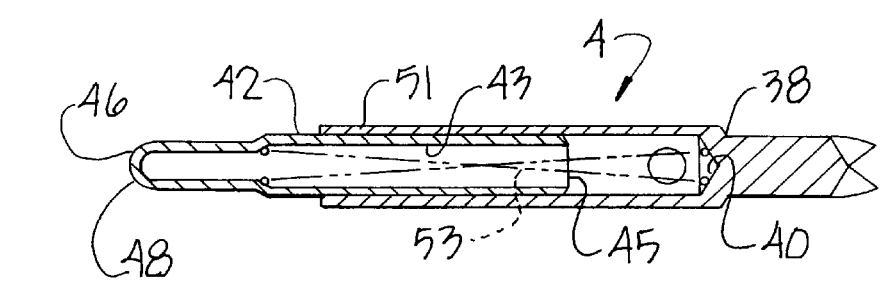
FIG. 5 is a longitudinal sectional view of the probe as it would be in a full test condition in the socket.
Figure 6:
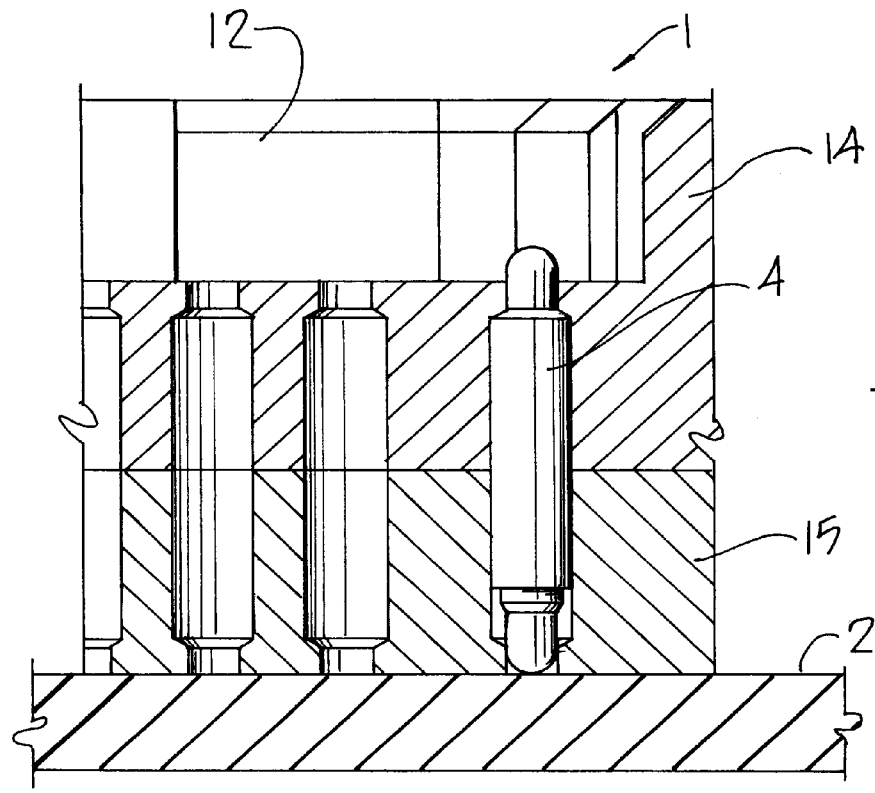
FIG. 6 is a sectional view of the probe within the test socket and compressed against an underlying circuit board.
Figure 7:
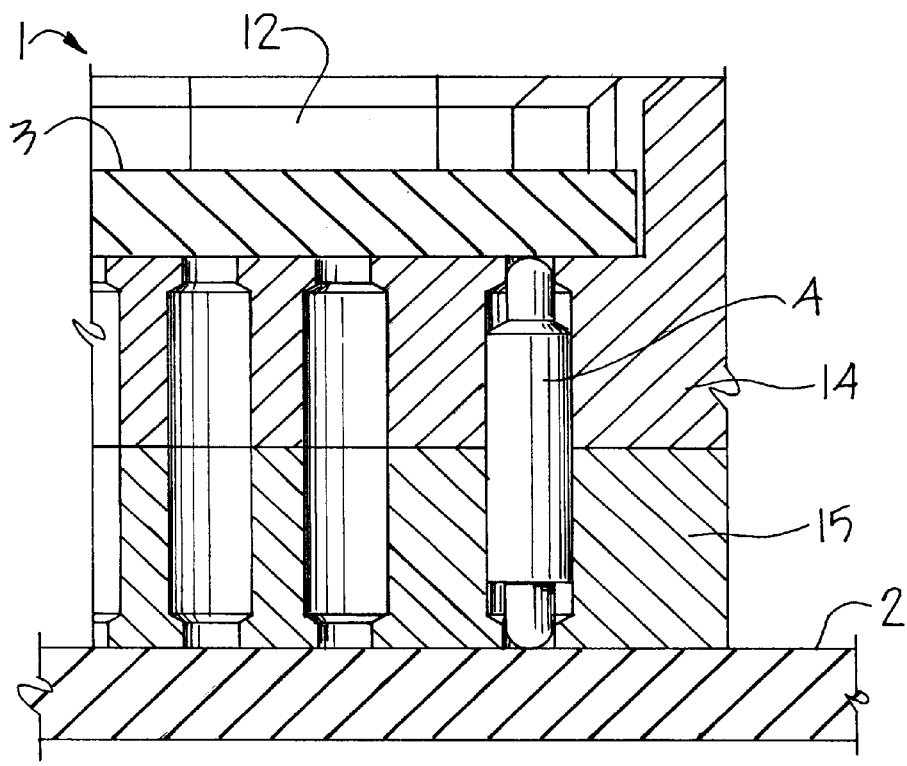
FIG. 7 is a sectional view of the probe in a test socket as it would be in a test condition.

Referring to FIGS. 4 and 5, the probe 4 consists of a barrel 30 which has a closed end 31 and an open end 32. The barrel 30 is partially hollow, with an axial bore 34 extending thereinto from the open end 32. The probe 4 is double ended, with the barrel closed end 31 terminating in an engagement tip 36. As is common in the industry, the engagement tip may be of various configurations and in the illustrated example, is of a four pointed crown design intended to engage the IC contact ball near its equator, leaving the critical center area of the ball unmarred. There is a step down shoulder 38 at the juncture between the barrel main diameter and the engagement tip 36. The shoulder 38 is sloped at an angle which matches the upper shoulder 26 of the test socket bore 19. The barrel interior bore 34 has an interior termination 40 generally adjacent the shoulder 38. The wall of the bore 34 is manufactured for maximum smoothness and consistent diameter.

The second major component of the probe 4 is the plunger 42 which is also hollow, with an interior bore 43 and has an open-end 45 and a closed end 46. Like the barrel closed end 31, the plunger closed end 46 terminates in an engagement tip 48. This is the tip that is intended to contact a site on the circuit board 2 when the probe 4 is mounted in the test socket 1. The engagement tip 48 is rounded or ball ended, and when placed in the test socket 1, stays in constant contact with the circuit site on the circuit board 2. An intermediate shoulder 50 necks the plunger 42 from a contact section 51 of a larger diameter matching the interior diameter of the barrel 30 to a smaller diameter section of the engagement tip 48, which slides through the test socket lower outlet 22. The entire interior of the plunger 42 is hollow.

A coil spring 53 is positioned within the probe 4 and extends between the interior diameter reduction at the shoulder 50 and the termination 40 of the barrel bore 34.

All parts of the probe 4, including the barrel 30, plunger 42 and coil spring 53, are preferably formed of a proprietary beryllium copper alloy, although they may be formed of other materials well known in the trade. The probe 4 may be gold plated, or plated by other highly conductive materials. For plating purposes, a hole 54 is retained in the barrel wall adjacent the termination 40.

As may be appreciated, the probe 4 is manufactured to very close tolerances. The probe 4 is extremely small and its components are smaller yet. For example, a probe 4 made according to the present invention and inserted into a test socket on 0.65 millimeter pitches, or distances center to center, has a barrel diameter in inches of 0.0215 to 0.0203; a barrel tip end diameter in inches of 0.0165 to 0.0157; a plunger diameter in inches of 0.0164 to 0.0156; and a plunger tip end diameter in inches of 0.0120 to 0.0114. The plunger and inside of the barrel have a diameter of 0.0164" to 0.0156" and are in substantially full, sliding contact without canting of the plunger inside the barrel. When zero force is applied to the probe 4, the total length is 0.2145"; when mounted within the test socket and in a free state therein at 0.37 oz. load, the total length is 0.2055"; when in a full test condition at 1.11 oz. load, the total length is 0.1875"; when fully retracted at 1.48 oz. load, the total length is 0.1785".

The probe 4 is intended for use in pitches (that is center to center distances) of 0.5 mm to 1.26 mm.

Other sizes of probes and test sockets can be constructed using the disclosed inventive concepts. For example, a second embodiment of such a probe has a total zero force length of 0.070", 0.063" length at a free state in the test socket, 0.055" under full test conditions and a 0.051"maximum travel. This short probe with extremely short stroke is useful for certain applications.

In all embodiments of the present invention, the consistency of stroke provides a constant and fully predictable resistance, making this probe particularly useful when used in a device for processing analog signals. The absence of a crimp provides maximum surface to surface contact area with constant resistance.

Other objects and advantages of the probe and test socket may be determined from the disclosure, which is not to be interpreted as limiting.

What is claimed and desired to be secured by letters patent is:

1. A test socket for testing integrated circuits comprising:
   a. Upper and lower test socket layers, the upper layer having a well therein to receive an integrated circuit for testing, the lower layer adapted for connection to a circuit board;
   b. a plurality of axially aligned bores extending through said socket layers with each bore having upper and lower internal shoulders narrowing the bore diameter adjacent bore outlets;
   c. a plurality of electrically conductive spring contact probes mounted in said bores, each probe consisting of;
      i. a barrel having a hollow barrel shaft with an axial inner bore and a necked down shoulder extending into a barrel tip adapted to engage a first electrical site;

ii. a plunger having a hollow plunger shaft with an axial inner bore and a necked down shoulder extending into a plunger tip adapted to engage a second electrical site, the plunger sized to fit snugly and slidably within said barrel shaft so that said barrel tip and plunger tip project in opposite directions to electrically connect the first and second sites;

iii. a spring trapped within the inner bore of a joined barrel shaft and plunger shaft and outwardly biasing said plunger from said barrel;

d. said probes trapped in the aligned bores in said socket layers with the upper and lower shoulders of said bores in said socket layers abutting the probe barrel and plunger shoulders to keep the probe barrel and plunger together, said probes being characterized by the absence of any means integral to the probes to hold the probe barrel and plunger together.

\* \* \* \* \*